United States Patent
Wolf et al.

(10) Patent No.: US 11,184,011 B2
(45) Date of Patent: Nov. 23, 2021

(54) CLOCK DETECTION AND AUTOMATIC PLL OUTPUT BYPASS SWITCHING FOR AN AUDIO PROCESSOR

(71) Applicant: Knowles Electronics, LLC, Itasca, IL (US)

(72) Inventors: Christopher K. Wolf, San Jose, CA (US); Frederic Denis Raynal, San Jose, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/888,627

(22) Filed: May 29, 2020

(65) Prior Publication Data
US 2020/0382126 A1    Dec. 3, 2020

Related U.S. Application Data

(60) Provisional application No. 62/855,449, filed on May 31, 2019.

(51) Int. Cl.
  *H03L 7/095* (2006.01)
  *H04L 7/033* (2006.01)
(52) U.S. Cl.
  CPC ............. *H03L 7/095* (2013.01); *H04L 7/033* (2013.01)

(58) Field of Classification Search
  CPC ........................................................ H03L 7/095
  USPC ........................................................ 375/376
  See application file for complete search history.

(56) References Cited

U.S. PATENT DOCUMENTS

| | | | | |
|---|---|---|---|---|
| 6,175,361 B1* | 1/2001 | Du | ............................ | G09G 5/12 345/213 |
| 2005/0144524 A1* | 6/2005 | Bonaccio | ................... | G06F 1/04 714/27 |
| 2007/0273410 A1* | 11/2007 | Miike | ........................ | G06F 1/08 327/99 |
| 2009/0160492 A1* | 6/2009 | Hailu | ......................... | G06F 1/08 327/99 |
| 2014/0145770 A1* | 5/2014 | Kropp | .................... | H03L 7/0814 327/158 |

\* cited by examiner

*Primary Examiner* — LiHong Yu
(74) *Attorney, Agent, or Firm* — Loppnow & Chapa; Matthew C. Loppnow; Roland K. Bowler, II (57) ABSTRACT

Systems and methods are disclosed for an audio processor that includes a clock detection circuit and a clock bypass circuit. According to various embodiments, the clock detection circuit can check and indicate the status of a main clock and upon detection of a loss of the main clock, the clock bypass circuit can switch the source of the main clock to an alternate source such as an on chip oscillator allowing the system to gracefully recover from the clock loss event.

17 Claims, 9 Drawing Sheets

CLOCK DETECTION AND AUTOMATIC PLL OUTPUT BYPASS SWITCHING FOR AN AUDIO PROCESSOR

TECHNICAL FIELD

The present embodiments relate generally to the field of clock signal detection and selection for processors.

BACKGROUND

Many electronic circuits, especially systems on chip (SoCs) including audio processors, are designed in such a way that they can receive clock signals from multiple sources including internal (on-chip) sources such as on-board oscillator and PLLs and external sources via input output pads. Some systems even have a main clock derived from a main clock source and auxiliary clocks derived from other auxiliary sources. When an electronic system is using an internal clock usually the system software or firmware can have complete control over that clock. However if the clock source is external then the system software or firmware has little control over that clock source. If the clock source is turned on and off, the circuitry, software, and other applications running on that external clock may enter an unknown or indeterminate state or may even suffer system failure. To avoid such a system disruption, there is a need for detecting the status of the clock indicating if the clock is on or off, or if the clock has turned on or turned off. Such clock detection can allow the software or other supporting system circuitry to take an appropriate action so that the system is not left hanging.

Additionally, it may be beneficial to have a way for a system having multiple clock sources to switch to an alternate clock source upon detection of loss of a main clock or a system clock.

SUMMARY OF THE INVENTION

Systems and methods are disclosed for an audio processor that includes a clock detection circuit and an automatic clock bypass circuit. The clock detection circuit informs and notifies a processor or a software process about the status of the clock, where as the clock bypass circuit switches the clock to an alternate clock source in the event of a loss of the main clock source. In various embodiments, the clocks may be received by various blocks (main processing block and other blocks) of the audio processor via internal or external sources. Both external and internal sources may include or be generated by oscillators or phase locked loops (PLLs). One of the outputs of the oscillators or PLLs may be used as a primary reference clock or a main clock for the main processing block. According to various embodiments, the clock detection circuit can check the status of the main clock and upon detection of a loss of main clock, the automatic clock bypass circuit can switch the source of the main clock to a different oscillator allowing the system to gracefully recover from the clock loss event. The automatic clock bypass circuit may also be referred to as a clock selection circuit.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present disclosure relates generally to clock detection and automatic clock or PLL bypass circuits.

In various embodiments, an audio processor includes a clock detection circuit which keeps track of the status a clock such as a main clock to a CPU. A finite state machine included in the clock detection circuit changes states according to the status of the clock. The status may be indicated with different states including "clock is on", "clock is off", "clock has turned on", and "clock has turned off". Furthermore, a programmable counter in the clock detection circuit can also further periodically indicate how long the clock has been in a particular state.

Additionally, in various embodiments, the audio processor includes an automatic clock bypass circuit which detects a clock loss event and switches to an alternate source of clock so that the system can successfully and gracefully recover from the clock loss event. The clock detection circuit and the automatic clock bypass circuit may be implanted advantageously for the main clock but can be extended to work for as many clocks possible and required by the design.

In many electronic circuits and systems, knowing the status of a main system clock may be crucial in order to avoid any system failure. The systems and methods disclosed herein can help avoid such system failures due to clock loss events.

Figure 1:
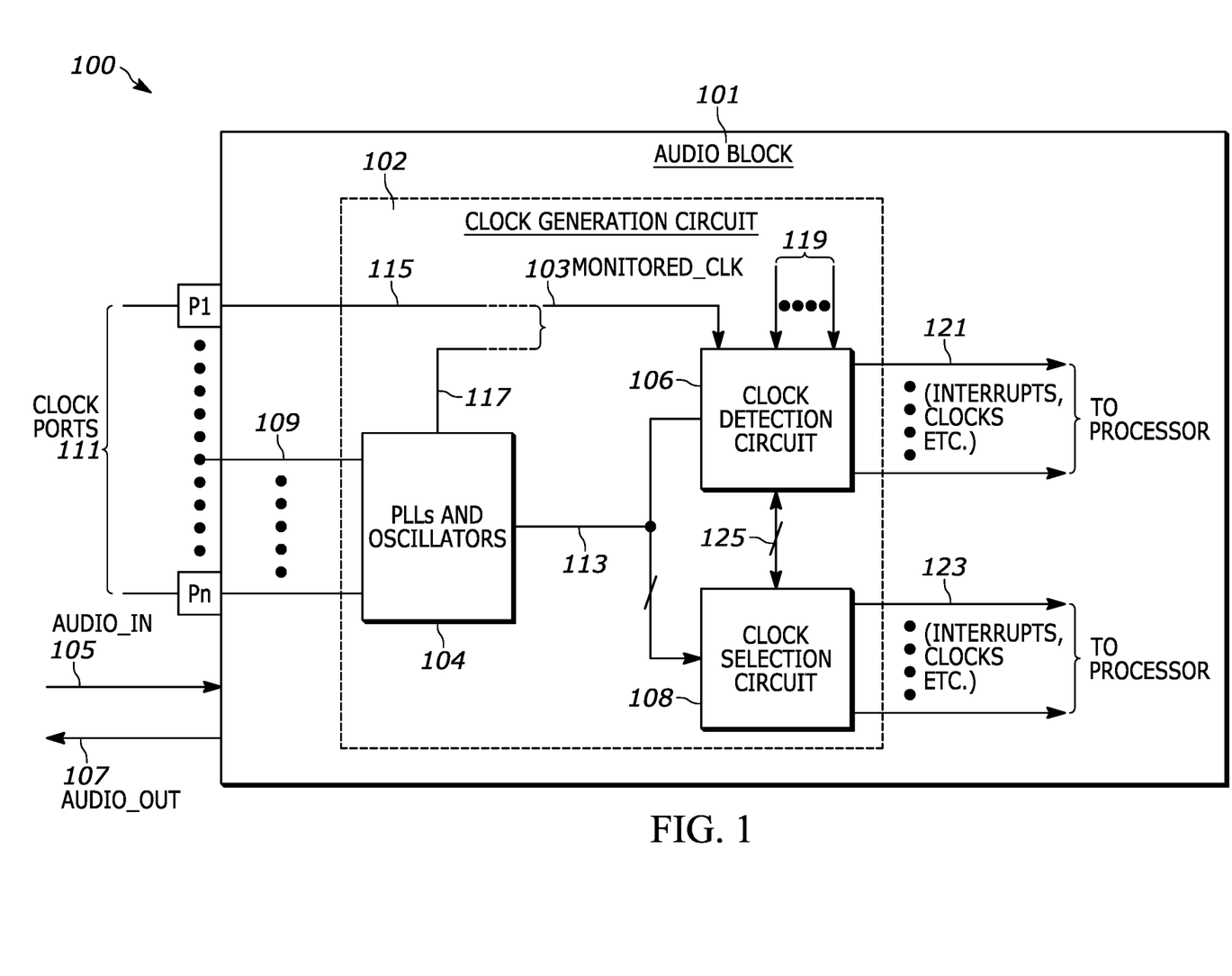
FIG. 1 is a block diagram illustrating an audio block in an audio processor according to an example embodiment.

FIG. 1 is a block diagram illustrating an audio block 101 in an audio processor in an audio system environment 100 according to an example embodiment. The audio block 101 has various clock ports 111 from p1 to pn, and may be coupled to receive a clock signal monitored_clk 103 via the port p1. Although not described in detail herein for sake of clarity of the present embodiments, audio block 101 may further be coupled to receive and process an audio_in signal 105, and coupled to output an audio_out signal 107. The audio block may include other ports and may receive or output other signals as well which are not shown here.

As shown, the audio block includes a clock generation circuit 102 which further includes a PLLs and oscillators block 104, and clock detection circuit 106 and a clock selection circuit 108. The PLLs and oscillators block 104 is coupled to output a clock signal 113 to the clock detection circuit 106 and the clock selection circuit 108. The clock detection circuit is coupled to receive the monitored_clk signal 103 via one of the external sources such as the port P1 115. In some embodiments, the monitored_clk 103 may also be received via the PLLs and oscillators block 104 as a signal 117. The signal 117 may be generated using one of various sources included in the PLLs and oscillators block 104 such as a primary PLL or a secondary PLL or an oscillator. Additionally, the PLLs and oscillators block 104 is coupled to communicate a set of signals 113 to the clock detection circuit 106 and clock selection circuit 108. The set of signals 113 may provide a clock to the circuitry included in the clock detection circuit 106 which is also coupled to receive other control signals 119. As will be explained in more detail below, the clock detection circuit 106 and the clock selection 108 circuit are configured to periodically detect a status of the monitored_clk signal 103 and in the event of a loss of the monitored_clk signal 103, the clock selection circuit 108 can switch the source of the monitored_clk signal 103 to an alternate source such as an oscillator or another PLL. In some embodiments, the signal monitored for loss of clock by the clock selection circuit 108 may different than the monitored_clk signal 103. The clock detection circuit 106 and the clock selection circuit 108 are further coupled to generate a plurality of signals such as interrupts, clocks etc. 121 and 123 respectively to the audio processor (not shown). The clock detection circuit 106 and the clock selection circuit 108 may communicate via a set of signals 125 to be described below. In some embodiments, the audio block 101 may be implemented as a part of the audio processor itself.

Figure 2:
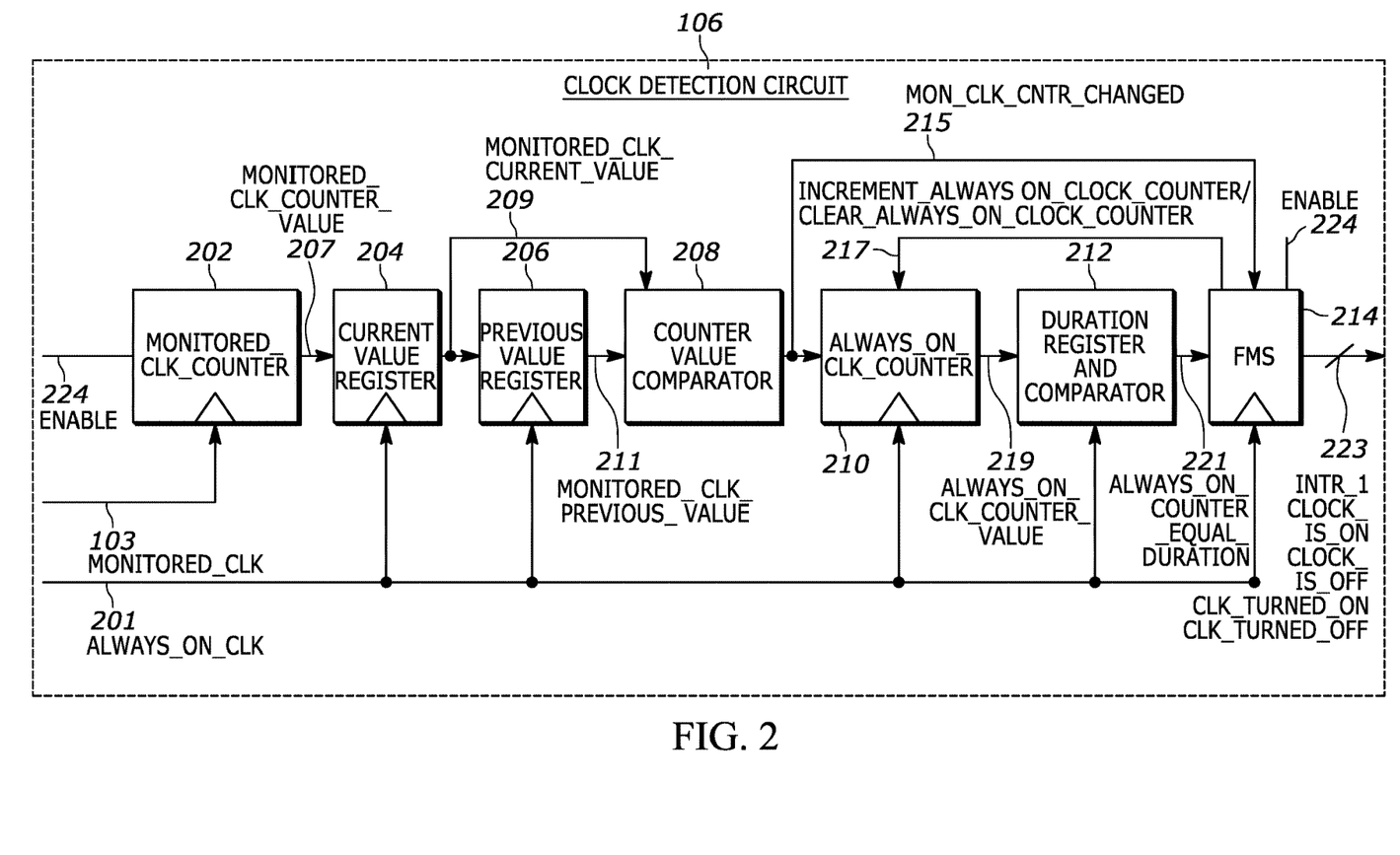
FIG. 2 is a block diagram illustrating a clock detection circuit included in the audio processor of FIG. 1, according to an example embodiment.

FIG. 2 is a block diagram illustrating the clock detection circuit 106 included in the audio system of FIG. 1, according to an example embodiment. The clock detection circuit 106 may include a counter monitored_clk_counter 202, a current value register 204, a previous value register 206, a counter value comparator 208, an always_on_clk_counter 210, a duration register and comparator 212, and a finite state machine (FSM) 214. The monitored_clk_counter 202 is coupled to receive an enable signal 224, an always_on_clk signal 201 and is clocked by the monitored_clk signal 103. The enable signal 224 and the always_on_clk signal 201 may be included in control signals 119 as shown in FIG. 1. The current value register 204, the previous value register 206, the counter value comparator 208, the always_on_clk_counter 210, the duration register and comparator 212, and the finite state machine 214 are all clocked by the always_on_clk signal 201.

The monitored_clk_counter 202 is coupled to output a signal monitored_clk_counter_value 207 to the current value register 204 which is coupled to output a signal 209 to the previous value register 206. The counter value comparator 208 is coupled to receive a signal monitored_clk_current_value 209 signal via the current value register 204 and a monitored_clk_current_value 209 signal via the previous value register 206. The always_on_clk_counter 210 is coupled to receive a signal mon_clk_cntr_changed 215 via the always_on_clk_counter 210 and an increment_always_on_clock_counter/clear_always_on_clock_counter 217 signal via the FSM 214. Further, the duration register and comparator 212 is coupled to receive a signal always_on_clk_counter_value 219 via the always_on_clk_counter 210 and the FSM 214 is coupled to receive an always_on_counter_equal_duration 221 signal via the duration register and comparator 212. The FSM is also coupled to receive the enable signal 224 and output a signal set 223 which indicates the status of the monitored_clk 103. The signal set 223 may include a plurality of signals intr_1, clk_is_on, clk_is_off, clk_turned_on, and clk_turned_off.

It may be appreciated that the current value register 204 and the previous value register 206 store a current value and a previous value of an active edge (either positive or the negative edge) of the monitored_clk signal 103. Further, the counter value comparator 208 is configured to compare the current value and the previous value of the monitored_clk 103 and accordingly cause the signal 215 to be '0' or '1'. In one example, the current value is equal to the previous value, then the signal 215 is '0' and if the current value is different from the previous value, then the signal 215 is '1', also indicating that the status of monitored_clk 103 has changed. The always_on_clk_counter 210 is configured to count the clock pulses of the always_on_clk signal 201 in response to the signal 217. In one example, the always_on_clk_counter 210 will increment on an active edge of the always_on_clk 201 if the signal 217 is '1' and will be cleared or be reset to '0' on an active edge of the always_on_clk 201 if the signal 217 is '0'.

The duration register and comparator 212 is configured to measure the duration of the status of the monitored_clk 103. In one example, the signal mon_clk_cntr_changed 215 indicates the status of the monitored_clk 103.

The monitored_clk signal 103 may have four statuses: clock_is_on, clock_is_off, clock_turned_on, or clock_turned_off. In one example, each status of the monitored_clk signal 103 may be indicated by four different signals: clock_is_on, clock_is_off, clock_turned_on, clock_turned_off asserting the corresponding signal for each status. In some examples, the statuses may be indicated by four bits of an internal register. In some other examples, the clock_is_off or clock_is_on may be indicated by a single signal on_off (not shown). When asserted the on_off signal may indicate that the clock_is_on and when de-asserted the on_off signal may indicate that the clock_is_off or vice versa.

Similarly, the clock_turned_off or clock_turned_on may be indicated by a single signal turned_on_off (not shown). When asserted the turned_on_off signal may indicate that the clock is turned on and when de-asserted the turned_on_off signal may indicate that the clock is turned off or vice versa.

The clock_is_on and clock_is_off signals are asserted in response to a comparison of the monitored_clk_current_value 209 and the monitored_clk_previous_value 211 of the monitored_clk signal 103 as indicated by the mon_clk_cntr_changed signal 215.

It may be assumed that the signals clock_is_on, clock_is_off, clock_turned_on, and clock_turned_off are initially de-asserted. If the current and the previous values as stored by the current value register 204 and the previous value register 206 are equal to zero then it is an indication that the monitored_clk signal 103 has not started yet and the status of the signals is as follows:
a) mon_clk_cntr_changed signal 215 is de-asserted
b) clock_turned_on 223 remains de-asserted
c) clock_is_off 223 is asserted
d) clock_turned_off 223 remains de-asserted.
If the current and previous values are unequal and non-zero, then it is an indication that the monitored_clk signal 103 has started and the status of the signals is as follows:

a) mon_clk_cntr_changed signal 215 is asserted
b) clock_turned_on 223 is asserted
c) clock_is_on 223 is asserted
d) clock_turned_off 223 remains de-asserted If the current and previous values are equal and non-zero, then it is an indication that the monitored_clk 103 has stopped and the status of the signals is as follows:
a) mon_clk_cntr_changed signal 215 is de-asserted
b) clock_turned_on 223 is de-asserted
c) clock_is_on 223 is de-asserted after a predefined duration
d) clock_turned_off 223 is asserted.

In some embodiments, the always_on_clk_cntr 210 begins to increment when the monitored_clk_current_value 209 and the monitored_clk_previous_value 211 become equal and are nonzero. In some embodiments, the clock_turned_on and clock_turned_off signals 223 are configured to indicate the status of the monitored_clk signal 103 after a predefined duration as set by the duration register and comparator 212 in terms of clock pulses of the always_on_clk signal 201. For example, if the duration set by the duration register and comparator 212 is "t", then when always_on_clock_counter_value 219 reaches the value "t", the clock_turned_on and clock_turned_off signals 223 will be asserted.

Figure 3:
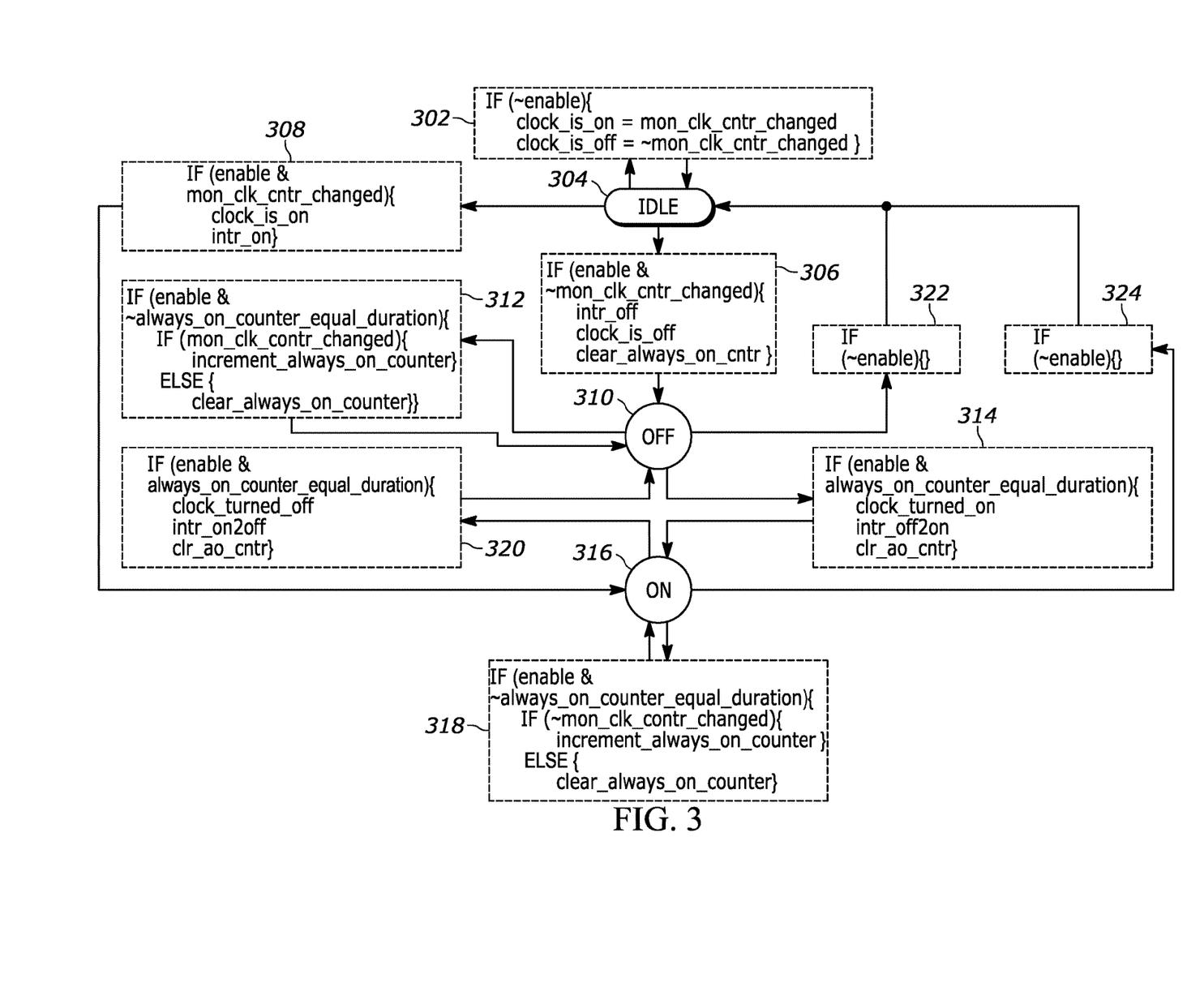
FIG. 3 is a state diagram illustrating a finite state machine included in the clock detection circuit of FIG. 2, according to an example embodiment.

FIG. 3 illustrates a state diagram of the FSM 214 included in the clock detection circuit 106 of FIG. 2, according to an example embodiment.

In one example, the FSM 214 proceeds through the states IDLE 304, OFF 310, and ON 316 in any order. The following paragraphs explain the conditions, statuses, assertions or de-assertions of various signals in various states and transitions of the FSM 214.

IDLE State 304:
The FSM may be assumed to be in this state initially and as long as the enable signal 224 is de-asserted. The FSM can also enter the IDLE state 304 from the OFF state 310 and from the ON state 316 whenever the signal 224 is de-asserted.

In this state, the value of the clock_is_on signal is equal to the asserted value of mon_clk_cntr_changed signal 215 and the value of the clock_is_off signal is equal to the value of the de-asserted mon_clk_cntr_changed signal 215.

OFF State 310:
The FSM can proceed to this state either from the IDLE state 304 or from an ON state 316.

From IDLE State 304 to OFF State 310:
The FSM enters this state from the IDLE state 304 if the enable signal is asserted and mon_clk_cntr_changed signal 215 is de-asserted. Further, the intr_off signal is asserted, clock_is_off is asserted, and signal 217 is de-asserted. In other words, this status indicates that the monitored clock is off.

From ON State 316 to OFF State 310:
The FSM enters the OFF state 310 from the ON state 316 if both enable signal and always_on_counter_equal_duration signal are asserted. Further, the clock_turned_off signal, and the intr2off (not shown) are asserted, and the signal 217 is de-asserted.

As long as the enable signal is asserted and always_on_counter_equal_duration signal is de-asserted, then the FSM 214 remains in the OFF state 310. Further, if the mon_clk_cntr_changed is asserted, signal 217 is asserted else the signal 217 is de-asserted.

ON State 316:
The FSM can proceed to this state either from the IDLE state 304 or from the OFF state 310.

From IDLE State 304 to ON State 316:
The FSM enters the ON state 316 from the IDLE 304 state if both enable signal and mon_clk_cntr_changed signals are asserted. Further, the clock_is_on signal and intr_on_signal (not shown) are asserted.

As long as the enable signal is asserted and always_on_counter_equal_duration signal is de-asserted then the FSM 214 remains in the ON state 316. Further, if mon_clk_cntr_changed is de-asserted, signal 217 is asserted else the signal 217 is de-asserted.

From OFF State 310 to ON State 316:
The FSM enters the ON state 316 from the OFF state 310, if both enable signal and always_on_counter_equal_duration signals are asserted.

In this state, the clock_turned_on signal, and the intr2offon (not shown) signal are asserted, and the signal 217 is de-asserted.

As long as the enable signal is asserted and always_on_counter_equal_duration signal is de-asserted then the FSM 214 remains in the ON state 316.

In this state, if signal mon_clk_cntr_changed 217 is asserted else the signal 217 is de-asserted.

Figure 4:
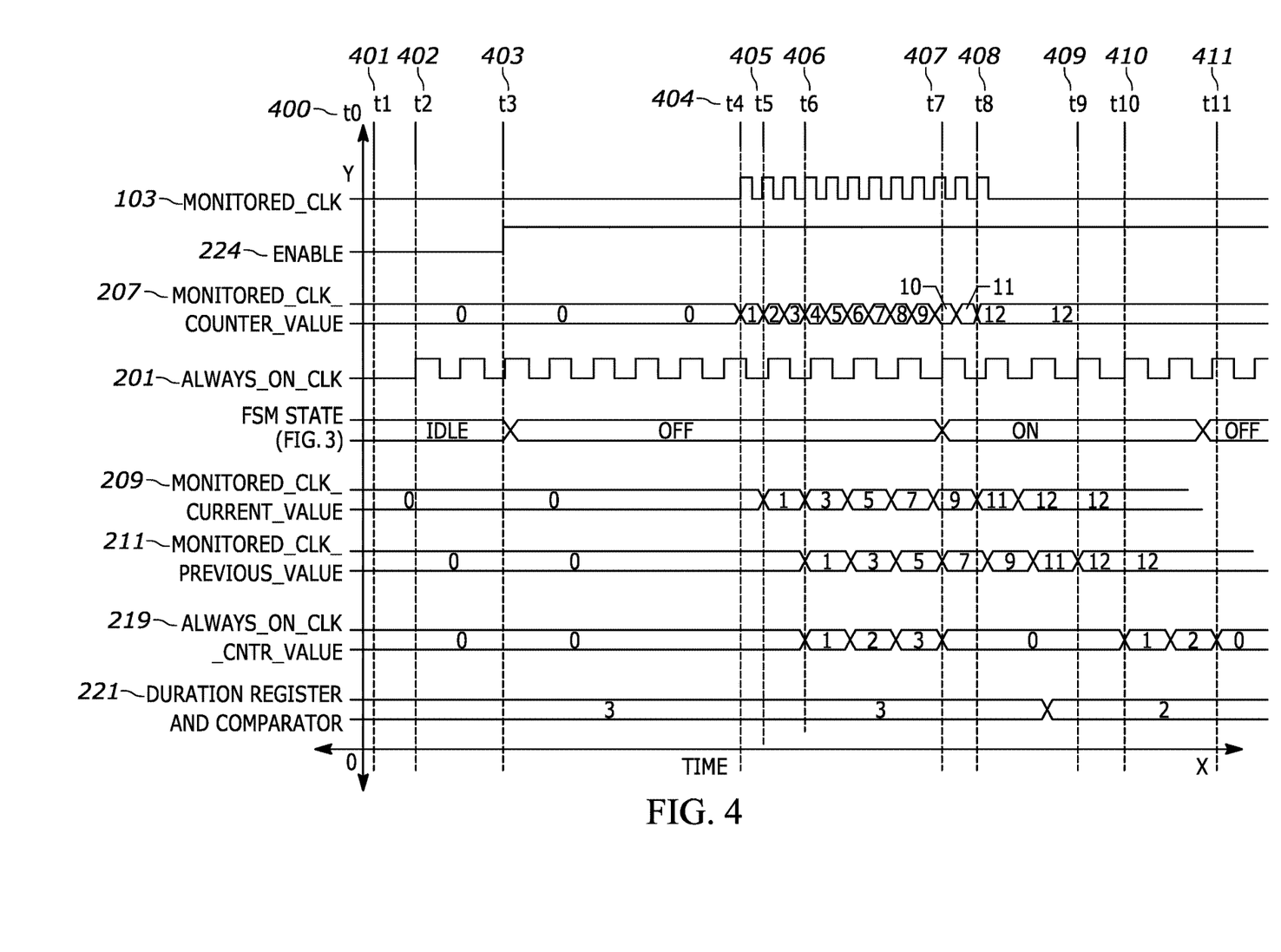
FIG. 4 is a timing diagram of various signals included in the clock detection circuit of FIG. 2, according to an example embodiment.

FIG. 4 is a timing diagram of various signals included in the clock detection circuit 106 of FIG. 2, according to an example embodiment. Shown in FIG. 4 are the signals monitored_clk signal 103, monitored_clk_counter_value 207, always_on_clk 201, FSM state as shown in FIG. 3, monitored_clk_previous_value 211, mon_clk_cntr_changed 215, and always_on_counter_equal_duration 221.

At time t0 400, it may be assumed that all the signals are de-asserted and all the counters are reset. The duration register and comparator 212 is preset at the value 3 and the FSM is in the IDLE state.

As can be seen, at time t1 401, the FSM is in idle state, the always_on_clk signal 201 is low, and enable signal 224 is de-asserted. At time t2 402, the always_on_clk signal 201 becomes high. At time t3 403, the enable signal 224 is asserted, and the FSM state changes from IDLE to OFF. At time t4 404, the monitored_clk signal 103 starts to run and as a result of that the monitored_clk_counter_value 207 (not shown in FIG. 4) starts to increment. At time t5 405, the monitored_clk_current_value 209 starts to increment on each active edge (positive edge in this example) of the always_on_clk signal 201. At time t6 406, the monitored_clk_previous_value 211 starts to follow the monitored_clk_current_value 209 and the always_on_clk_cntr 219 also starts incrementing. In this example, the duration register and comparator 212 is preset to a value 3. At time t7 407, after the always_on_clk_cntr 219 is equal to 3, the FSM state changes to ON state as values of the signals monitored_clk_current_value 209 and monitored_clk_previous_value 211 are different. The always_on_clk_cntr 219 is also reset to 0 as explained previously with respect to FIG. 3.

After time t8 408, the monitored_clk signal 103 stops and so does the monitored_clk_counter_value 207 after incrementing to 12.

At time t9 409, the monitored_clk_current_value 209 and monitored_clk_previous_value 211 become equal and the always_on_clk_cntr 219 starts to increment again at time t10 410.

At this time the duration register and comparator 212 is preset to a value 2. Therefore at time t11 411, when the always_on_clk_cntr 219 becomes equal to 2 the monitored_clk_current_value 209 and monitored_clk_previous_value 211 are compared again. Since the two values are now equal and non-zero, the FSM state changes from ON to OFF as explained earlier with respect to FIG. 3.

Figure 5A:
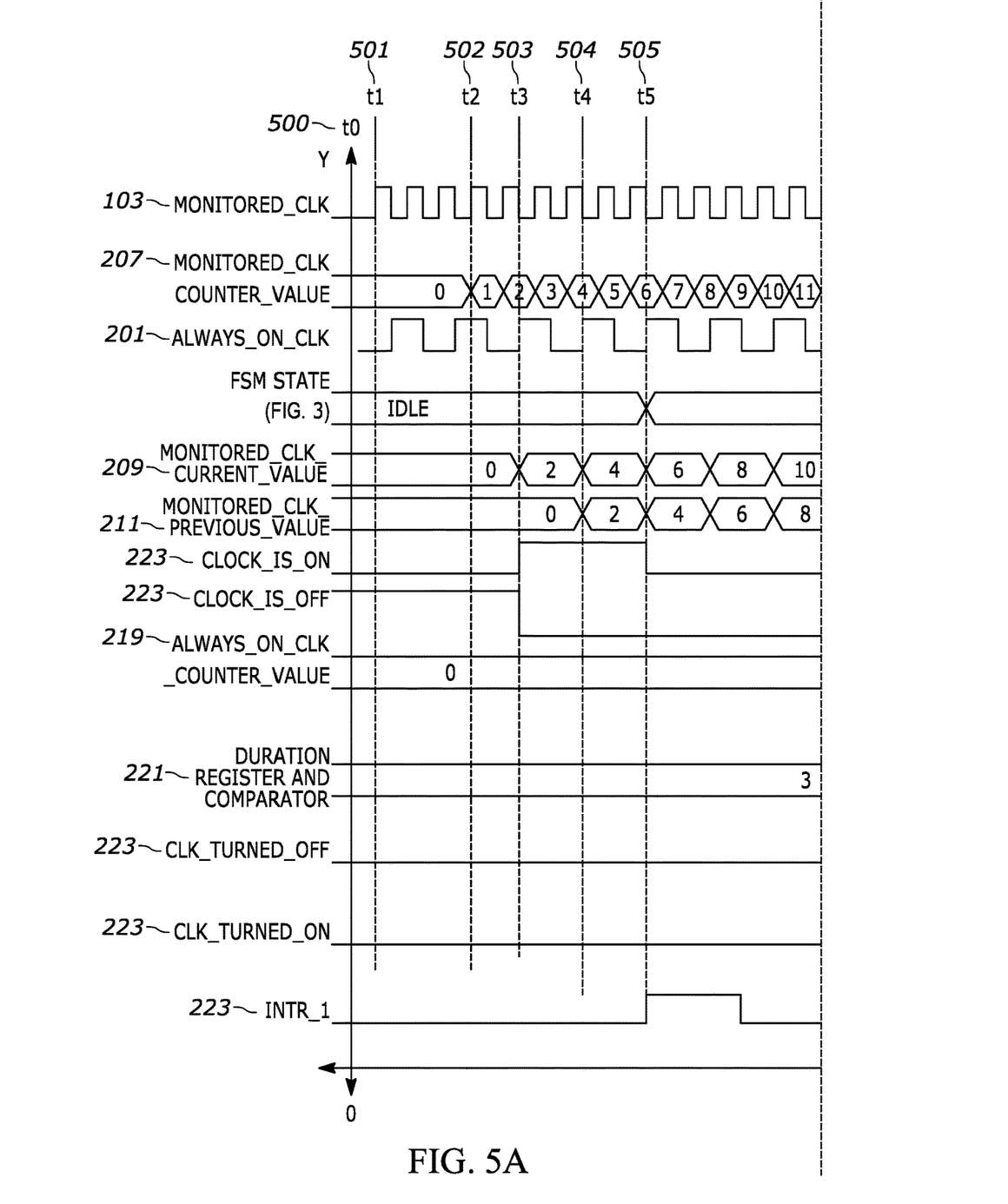
FIGS. 5A and 5B is another timing diagram of various signals included in the clock detection circuit of FIG. 2, according to an example embodiment.
Figure 5B:
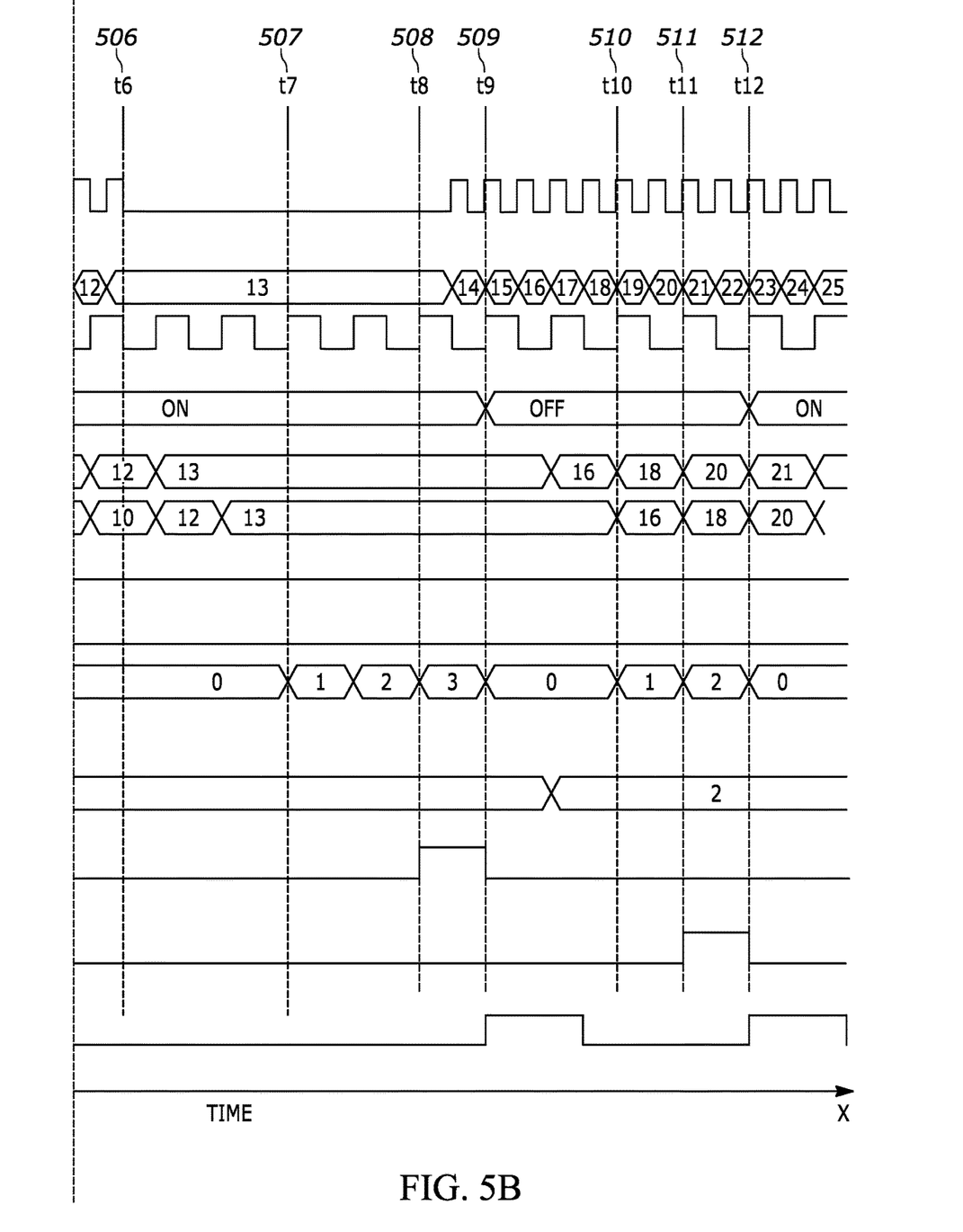

FIGS. 5A and 5B is another timing diagram of various signals included in the clock detection circuit 106 of FIG. 2, according to an example embodiment. Shown in 5A and 5B are the signals monitored_clk 103, monitored_clk_counter_value 207, always_on_clk 201, FSM state (as shown in FIG. 3), monitored_clk_current_value 209, monitored_clk_previous_value 211, clock_is_on (a signal in the signal set 223), clock_is_off (a signal in the signal set 223), always_on_clk_counter 219, duration register and comparator 212, clock_turned_off (a signal in the signal set 223), clock_turned_on (a signal in the signal set 223), and intr_1 (a signal in the signal set 223).

At time t0 500, it may be assumed that all the signals are de-asserted and all the counters are reset. The duration register and comparator 212 is preset at the value 3 and the FSM is in the IDLE state.

At time t1 501, the monitored_clk 103 signal starts running. At time t2 502, the monitored_clk_counter_value 207 begins to increment.

At time t3 503, the monitored_clk_current_value 209 begins to increment and the clock_is_on signal 223 is asserted and the clock_is_off signal 223 is de-asserted.

At time t4 504, the monitored_clk_previous_value 211 begins to increment.

At time t5 505, the clock_is_on signal 223 may be de-asserted and the inter_1 signal 223 is asserted which may trigger a hardware or a software reset or both. The FSM state changes from IDLE to ON.

At time t6 506, the monitored_clk 103 stops running.

At time t7 507, the monitored_clk_current_value 209 and monitored_clk_previous_value 211 are equal and the always_on_clk_counter_value 219 starts to increment.

At time t8 508, the always_on_clk_counter_value 219 becomes equal to 3 which is the preset value of the duration register and comparator 212. As a result of this the clock_turned_off signal 223 is asserted.

At time t9 509, the FSM state changes from ON to OFF.

Between time t8 508 and t9 509, the monitored_clk 103 starts running again. Soon after time t9 509, the monitored_clk_current_value 209 and monitored_clk_previous_value 211 start incrementing again and the duration register and comparator 221 is preset to a value 2.

At time t10 510, after both the values become equal, the always_on_clk_counter_value 219 starts to increment.

At time t11 511, the always_on_clk_counter_value 219 becomes equal to 2, which the value preset in the duration register and comparator 221. The clk_turned_on signal 223 is asserted.

At time t12 512, the FSM state changes from OFF to ON.

The intr_1 signal is asserted as a pulse every time the FSM changes state as shown at times t5 505, t9 509, and t12 512.

Figure 6:
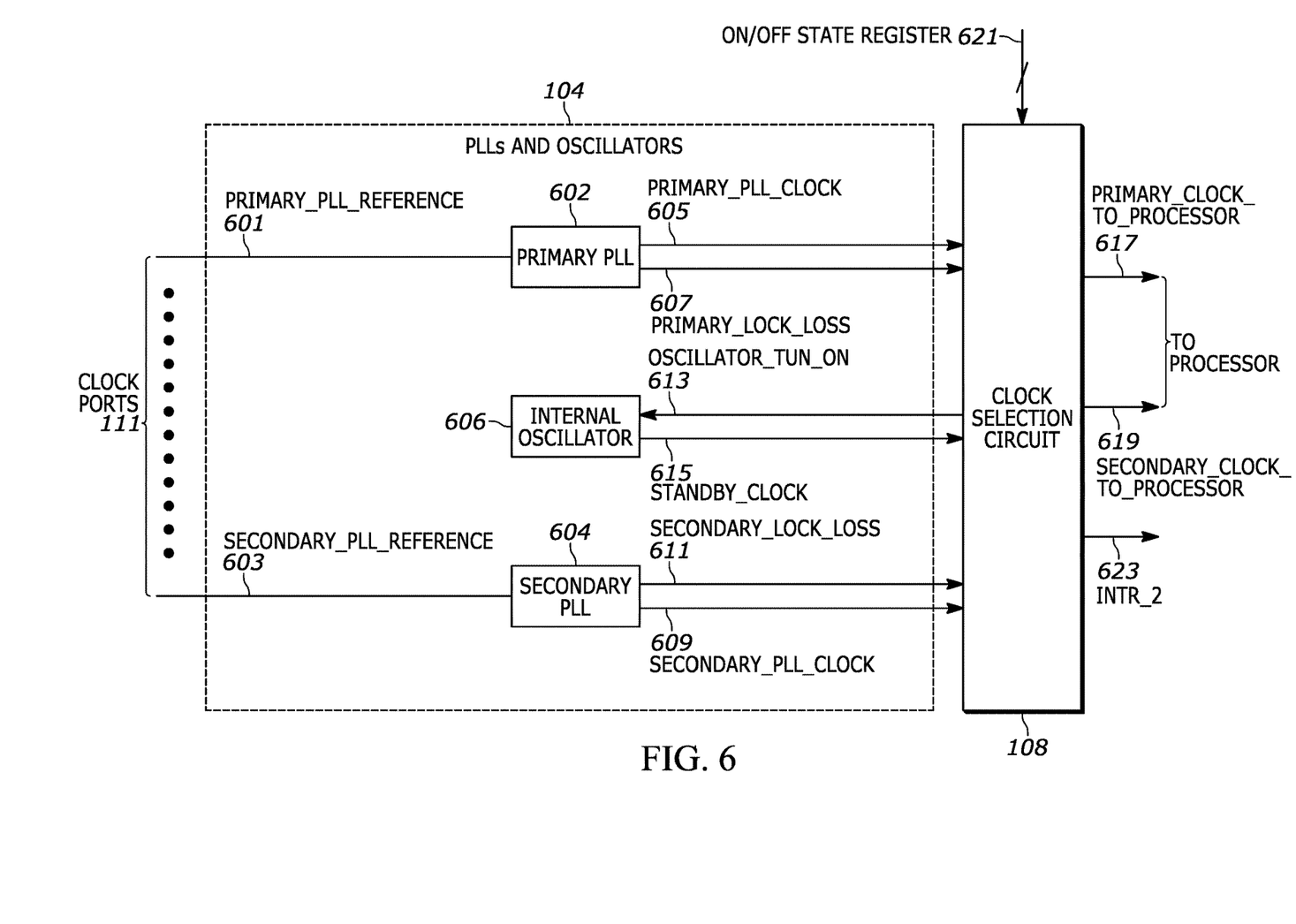
FIG. 6 is a block diagram illustrating some details of a PLL and Oscillators block and a clock selection circuit included in the audio processor of FIG. 1, according to an example embodiment.

FIG. 6 is a block diagram illustrating some details of a PLL and oscillators block 104 and the clock selection circuit 108 included in the audio processor of FIG. 1, according to an example embodiment. As shown, the block 104 includes a primary pll 602, a secondary pll 604, and an internal oscillator 606. The primary pll 602 is coupled to receive a primary_pll_reference_signal 601 via one of the clock ports 111 and is coupled to output a primary_pll_clock signal 605 and a primary_lock_loss signal 607 to the clock selection circuit 108. The secondary pll 604 is coupled to receive a secondary_pll_reference_signal 603 via one of the clock ports 111 and is coupled to output a secondary_pll_clock signal 609 and a secondary_lock_loss signal 611 to the clock selection circuit 108. The internal oscillator 606 is coupled to receive an oscillator turn signal 613 and is coupled to output a standby_clock signal 615 to the clock selection circuit.

The clock selection circuit 108 is coupled to receive an on/off state register (not shown) bits 621 and is coupled to output signals primary_clock_to_processor 617, secondary_clock_to_processor 619, and intr_2 623 to the audio processor (not shown). Referring back to FIG. 1, the signals 617 and 619 are part of the signal set 123.

It may be appreciated by those skilled in the art that under normal operating conditions, the phase or frequency of the primary_clock_signal 605 is locked to that of the input clock of the primary_pll_reference 601 signal. In an event where the primary_pll_reference 601 is lost or interrupted, the pll lock will also be lost. The primary pll 602 is configured to indicate a loss of lock via the primary_lock_loss signal 607 by asserting (in this example) or de-asserting (in other examples) the signal 607. The selection circuit 108 is configured to switch the primary_pll_clock signal 605 to either the standby_clock signal 615 generated by the internal oscillator 606 or the secondary_pll_clock 609.

Similarly, under normal operating conditions, the phase or frequency of the secondary_clock_signal 609 is locked to that of the input clock of the secondary_pll_reference 603 signal. In an event where the secondary_pll_reference 603 is lost or interrupted, the pll lock will also be lost. The secondary pll 604 is configured to indicate a loss of lock via the secondary_lock_loss signal 611 by asserting (in this example) or de-asserting (in other examples) the signal 611. The selection circuit 108 is configured to the secondary_pll_clock signal 609 to either the standby_clock signal 615 generated by the internal oscillator 606 or the primary_pll_clock 605.

The above configuration may be repeated for as many plls as necessary and possible per the design considerations.

Figure 7:
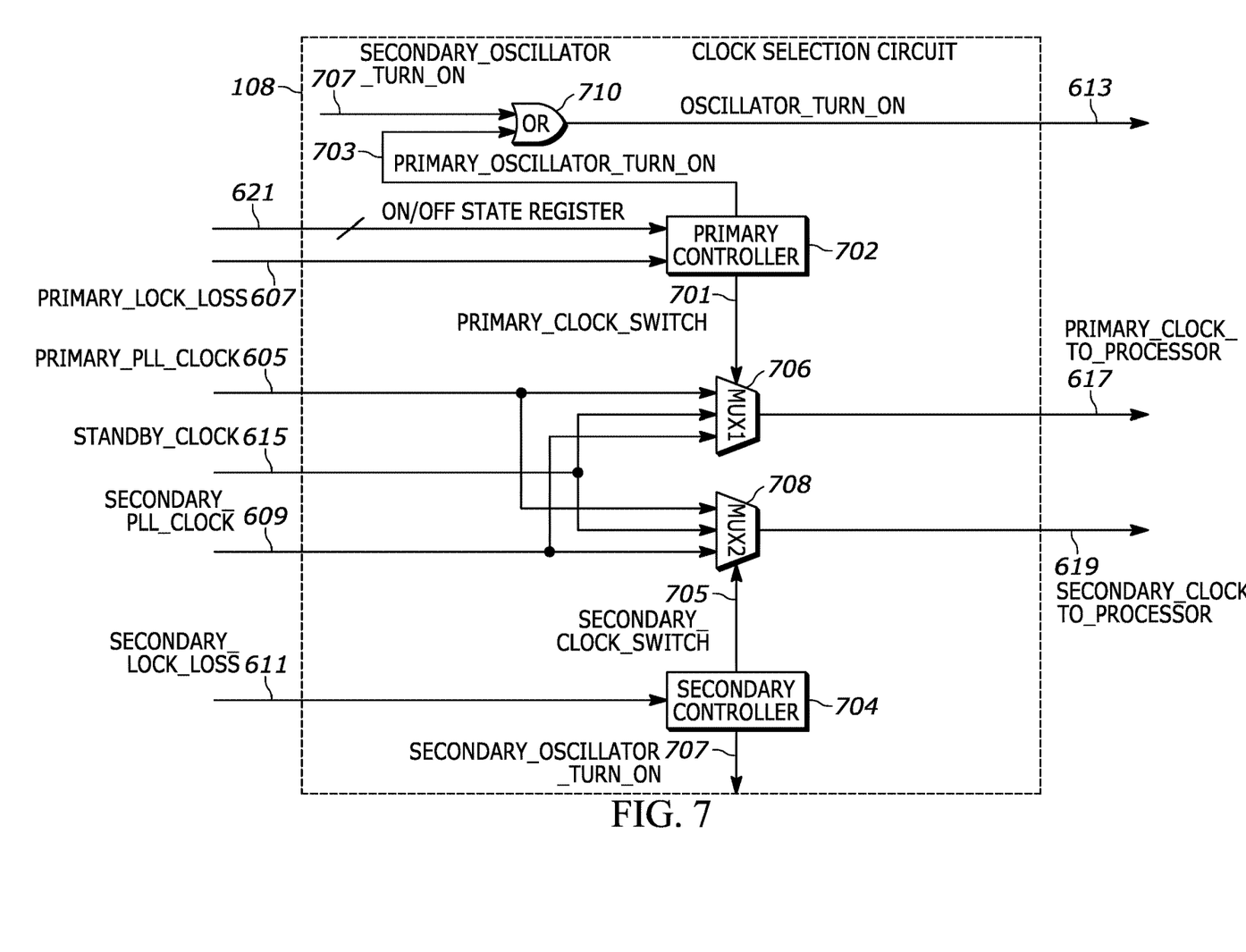
FIG. 7 is a block diagram of the clock selection circuit of FIG. 6, according to an example embodiment.

FIG. 7 is a circuit diagram of the clock selection circuit 108 of FIG. 1 and FIG. 6, according to an example embodiment. As shown, the clock selection circuit 108 comprises a primary controller 702, a secondary controller 704, a first multiplexer mux1 706, a second multiplexer mux2 708, and an OR gate 710.

Both mux1 and mux2 are coupled to receive the primary_pll_clock 605, the secondary_pll_clock 609, and the standby_clock 615. The primary controller 702 is responsive to a primary clock loss event and in one example, may be configured to assert the signal primary_clock_switch 701 when the primary_lock_loss signal 607 is asserted. The secondary controller 704 is responsive to a secondary clock loss event and in one example, may be configured to assert the signal secondary_clock_switch 705 when the secondary_lock_loss signal 611 is asserted.

The mux1 706 is configured to output one of the 605 or 609 or 615 signal in response to the primary_clock_switch signal 701. In one example, if the signal 701 is de-asserted (under normal conditions) then the primary_pll_clock 605 is output as primary_clock_to_processor signal 617; and when signal 701 is asserted, either the standby_clock 615 or secondary_pll_clock 609 is output as signal 617. In the event that the primary clock is lost, the primary_lock_loss signal 607 is asserted as explained with respect to FIG. 6, which is sensed by the primary controller 702 which then asserts the signal 701 and the mux1 706 selects either the standby_clock 615 or secondary_pll_clock 609 to be output as the primary_clock_to_processor 617. Additionally, primary controller 702 asserts the primary_clock_switch 701 in response to the values of on/off state register bits 621.

Similarly, in one example, if the signal 705 is de-asserted (under normal conditions) then the secondary_pll_clock 609 is output as secondary_clock_to_processor signal 619; and when signal 705 is asserted, either the standby_clock 615 or the primary_pll_clock 605 is output as signal 617. In the event that the secondary clock is lost, the secondary_lock_loss signal 611 is asserted as explained with respect to FIG. 6, which is sensed by the secondary controller 704 which then asserts the signal 705 and then the mux2 708 selects either the standby_clock 615 or primary_pll_clock 605 to be output as the secondary_clock_to_processor 619. In other examples, the secondary controller 704 asserts the secondary_clock_switch 705 in response to the values of on/off state register bits 621.

In one example, the primary controller 702 and the secondary controller 704 are configured to output signals primary_oscillator_turn_on 703 and secondary_oscillator_turn_on 707 which may be fed to the OR gate 710 to generate the signal oscillator_turn_on 613 which further may be used to turn on the internal oscillator 606.

Figure 8:
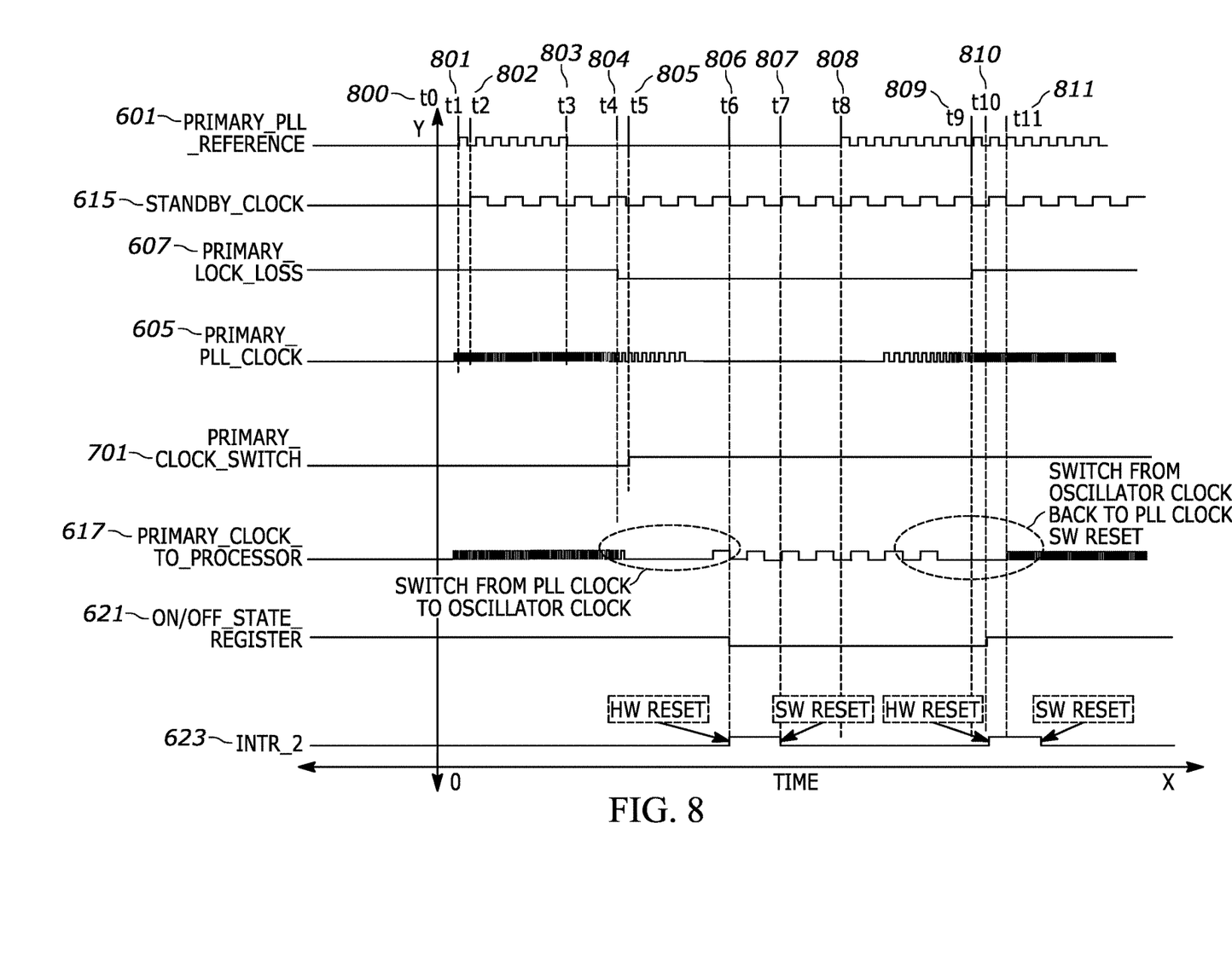
FIG. 8 is a timing diagram of various signals included in the PLL and Oscillators block and the clock selection circuit of FIGS. 6 and 7, according to an example embodiment.

FIG. 8 is a timing diagram of various signals included in the PLL and oscillators block 104 and the clock selection circuit 108 of FIGS. 6 and 7, according to an example embodiment. Illustrated in FIG. 8 are the signals primary_pll_reference 601, standby_clock 615, primary_lock_loss 607, primary_pll_clock 605, primary_clock_switch 701, primary_clock_to_processor 617, on/off_state_register bits 62, and the interrupt signal intr_2 632.

At time t0 800, it may be assumed that all the signals are de-asserted.

Starting at time t1 801, the primary_pll_reference 601 starts running and the primary_pll_clock 605 is locked to the primary_pll_reference 601 signal.

At time t2 802, the standby_clock signal 615 also starts running, however, the primary_clock_switch 701 is de-asserted, and therefore the primary_clock_to_processor signal 617 is the same as the primary_pll_clock signal 605.

At time t3 803, the primary_pll_reference_signal 601 stops. As result of that the primary_lock_loss signal 607 is de-asserted at time t4 804.

At time t5 805, the primary_clock_switch signal 701 is asserted.

At time t6 806, At this time any representative bit of the on/off_state_register 621 is de-asserted and the primary_clock_to_processor 617 switches to the standby_clock 615 which is the oscillator clock. This may cause the intr_2 signal 623 to trigger a hardware reset to the audio processor (not shown). Further at time t7 807, there may be a software reset generated from the hardware reset.

At time t8 808, the primary_pll_reference 601 starts running again. As a result of that the primary_lock_loss signal 607 is de-asserted at time t9 809 and the primary_pll_clock 605 is restored.

At time t10 810, the representative bit of on/off_state_register 621 is de-asserted. This may cause another hardware reset which may further generate another software reset.

At time t11 811, the primary_clock_to_processor 617 switches back to the primary_pll_clock 605.

According to a 1st possible embodiment of a possible implementation, an audio processor can include a clock detection circuit configured to be clocked by an always-on clock signal. The clock detection circuit can include a first counter configured to be incremented by a first clock signal. The clock detection circuit can include a first register coupled to the first counter and configured to store a current value of the first counter when clocked by the always-on clock signal. The clock detection circuit can include a second register coupled to the first counter and configured to store a previous value of the first counter when clocked by the always-on clock signal. The clock detection circuit can include a first comparator coupled to the first and second registers and configured to compare the current value and the next value when clocked by the always-on clock signal. The clock detection circuit can include a second counter coupled to the first comparator and configured to increment for every always-on clock cycle when the current count value stored in the first register is different than the previous count value stored in the second register. The clock detection circuit can include a third register which is configured to hold a maximum value of always-on clock count to be compared to the output of the second counter. The clock detection circuit can include a second comparator coupled to the third register and the second counter and configured to compare the always-on clock count to the maximum always-on clock count. The clock detection circuit can include a finite state machine (FSM) coupled to the first comparator and configured to provide an interrupt indicating the state of the first clock signal based on the comparison of the first comparator.

According to a 2nd possible embodiment, for the processor of embodiment 1 further comprising an external clock interface coupled to the first counter, wherein the first clock signal is an external clock signal received at the external clock interface.

According to a 3rd possible embodiment, for the processor of embodiment 2, wherein the FSM is configured to provide the interrupt only after the current value and the next value have remained in a certain state for a specified duration.

According to a 4th possible embodiment, for the processor of embodiment 2 further comprising the clock detection circuit can include a local oscillator configured to provide the always-on clock signal.

According to a 5th possible embodiment, for the processor of embodiment 2, wherein the FSM is configured to provide an interrupt indicating one of the following: the external clock signal is OFF; the external clock signal is ON; the external clock signal has turned OFF, after providing an interrupt indicating that the external clock signal is ON; the external clock signal has turned ON, after providing an interrupt indicating that the external clock signal is OFF or has turned OFF.

According to a 6th possible embodiment, for the processor of embodiment 2, wherein the clock detection circuit further comprises: a second counter coupled to the first comparator and configured to be clocked by the always-on clock and generate a count based on a time during which the current value and the next value remain in a certain state; and a second comparator coupled to the second counter and to the FSM, the second comparator configured to compare the count generated by the second counter with a reference count, wherein the FSM provides the interrupt based on the comparison of the second comparator.

According to a 7th possible embodiment, for the processor of embodiment 1, wherein the FSM is in an OFF state if the current value and the next value are both equal to zero.

According to an 8th possible embodiment, for the processor of embodiment 7, wherein the FSM moves from the OFF state to an ON state if the current value and the next value are equal to different nonzero values.

According to a 9th possible embodiment, for the processor of embodiment 8, wherein the FSM moves from the ON state to the OFF state if the current value and the next value are both equal to the same nonzero value.

According to a 10th possible embodiment, for the processor of embodiment 9, further comprising the clock detection circuit can include an ON-OFF duration register having a predefined duration value, wherein the current value and the next value are compared after receiving a number of clock pulses equal to the duration value.

According to a 11th possible embodiment, for the processor of embodiment 10, wherein when the FSM is in the ON state and the current value and the next value are both different nonzero values, then the FSM moves to the OFF state.

According to a 12th possible embodiment, for the processor of embodiment 10, wherein when the FSM is in the OFF state, and the current value and the next value are both different nonzero values, then the FSM moves to the ON state.

A 13th possible embodiment can provide a method of monitoring an external clock signal provided to an audio processor. The method can include incrementing a first counter by the external clock signal. The method can include storing a current value of the first counter in a first register clocked by a second clock signal. The method can include storing a next value of the first counter in a second register clocked by the second clock signal. The method can include comparing the current value and the next value. The method can include indicating a state of the external clock signal based on the comparison only after the current value and the next value have remained in a certain state for a specified duration.

According to a 14th possible embodiment, for the method of embodiment 13 further comprising the method can include configuring a finite state machine (FSM) in an idle state or an ONstate or an OFF state based on the comparison, wherein the state of the FSM indicates the state of the external clock signal.

According to a 15th possible embodiment, for the method of embodiment 14, wherein controlling includes causing the FSM to be in the OFF state if the current value and the next value are both equal to zero.

According to a 16th possible embodiment, for the method of embodiment 14, wherein controlling includes causing the FSM to transition from the OFF state to the ON state if the current value and the next value are equal to different nonzero values.

According to a 17th possible embodiment, for the method of embodiment 15, wherein controlling includes causing the FSM to be in the OFF state if the current value and the next value are both equal to the same nonzero value.

Various embodiments of the present technology can be practiced with any electronic systems including multiple internal and external clocks.

The present embodiments have been described in detail with reference to the drawings, which are provided as illustrative examples of the embodiments so as to enable those skilled in the art to practice the embodiments and alternatives apparent to those skilled in the art. Notably, the figures and examples herein are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments are described, and detailed descriptions of other portions of such known components are omitted so as not to obscure the present embodiments. Embodiments described as being implemented in software should not be limited thereto, but can include embodiments implemented in hardware, or combinations of software and hardware, and vice versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

For simplicity and clarity of illustration, elements in the figures are not necessarily drawn to scale, and the same reference numbers in different figures denote generally the same elements. Additionally, numerals for similar portions in the figures, have been shown when necessary to understand the description. Additionally, descriptions and details of well-known steps and elements may be omitted for simplicity of the description With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

Throughout this specification, '0' is used to indicate a logic low and '1' is use to indicate a logic high value. Further, the term "active edge of a clock" may be either a positive edge or a negative edge of the clock depending on the design.

Additionally, "enabling" or "disabling" a signal may be referred to as "asserting" or "de-asserting" a signal. Also in general, that a signal may be asserted by making it "1" and de-asserted by making it "0" "1" and vice-versa.

What is claimed is:

1. An audio processor comprising:
    a processing core;
    a multiplexer having a primary clock signal input and a secondary clock signal input, the multiplexer configured to output the primary clock signal to the processing core;
    a primary phase locked loop (PLL) configured to generate a phase lock loss signal when the primary clock signal provided to the processing core loses phase lock; and
    a controller coupled to the multiplexer and configured to output a clock switch signal to the multiplexer in response to the phase lock loss signal,
    wherein the multiplexer is configured to output the secondary clock signal in response to receiving the clock switch signal from the controller,
    wherein the controller is configured to interrupt the processing core in response to the phase lock loss signal.

2. The processor of claim 1, wherein the controller is implemented in hardware.

3. The processor of claim 2, further comprising a phase lock detect circuit coupled to the primary PLL and to the controller.

4. The processor of claim 1, wherein the multiplexer is a glitch-free multiplexer.

5. The processor of claim 1, further comprising an oscillator circuit, wherein the secondary clock signal is generated by the oscillator circuit.

6. The processor of claim 1, further comprising a secondary PLL coupled to the multiplexer and configured to output the secondary clock signal based on a secondary reference signal.

7. The processor of claim 6, wherein the multiplexer is a glitch-free multiplexer configured to switch between the primary clock signal and the secondary clock signal within a few reference clock cycles.

8. The processor of claim 1, wherein the multiplexer is a glitch-free multiplexer configured to switch between the primary clock signal and the secondary clock signal without system disrupting artifacts on output of multiplexer.

9. A clock selection circuit for an audio processor, the circuit comprising:
    a primary phase locked loop (PLL) configured to output a primary clock signal based on a primary reference signal;
    a primary controller coupled to the primary PLL and configured to output a primary clock switch signal in response to receiving a primary lock loss signal from the primary PLL, wherein the primary clock switch signal is disabled when the primary lock loss signal indicates a PLL lock and enabled when the primary lock loss signal indicates a loss of PLL lock; and
    a multiplexer coupled to the primary controller and to the primary PLL, the multiplexer configured to output the primary clock signal when the primary clock switch signal is disabled and to output a secondary clock signal when the primary clock switch signal is enabled,
    wherein the controller is configured to provide an interrupt in response to receiving a primary lock loss signal from the primary PLL.

10. The circuit of claim 9, further comprising an oscillator circuit configured to generate the secondary clock signal.

11. The circuit of claim 9, wherein the multiplexer is a glitch-free multiplexer.

12. The circuit of claim 9, further comprising a secondary PLL configured to generate the secondary clock signal based on a secondary reference signal.

13. A method of selecting a clock signal in an audio processor, the method comprising:
    providing a primary clock signal to a processing core via a multiplexer;
    using a phase lock loss signal provided by a primary phase locked loop (PLL) when the primary clock signal provided to the processing core loses phase lock;
    configuring the multiplexer to output a secondary clock signal to the processing core in response to the phase lock loss signal; and
    interrupting the processing core in response to the lock loss signal.

14. The method of claim 13, further comprising generating the secondary clock signal using an oscillator circuit.

15. The method of claim 13, further comprising generating, by a secondary PLL, the secondary clock signal based on a secondary reference signal.

16. The method of claim 15, wherein the primary PLL and the secondary PLL are on a common integrated circuit, the method further comprising receiving a primary reference signal from which the primary clock signal is generated from a clock source external to the integrated circuit.

17. The method of claim 13,
    wherein configuration of the multiplexer and interruption of the processing core are performed by a controller implemented in hardware and wherein the multiplexer is a glitch-free multiplexer.

* * * * *